(12) United States Patent
Kozko

(10) Patent No.: US 9,277,662 B1
(45) Date of Patent: Mar. 1, 2016

(54) CIRCULAR ARRANGEMENT OF REDUNDANT CONNECTION POINTS FOR ELECTRONIC DEVICE COUPLING

(71) Applicant: Dmitry Kozko, Aventura, FL (US)

(72) Inventor: Dmitry Kozko, Aventura, FL (US)

( * ) Notice: Subject to any disclaimer, the term of this patent is extended or adjusted under 35 U.S.C. 154(b) by 172 days.

(21) Appl. No.: 14/065,972

(22) Filed: Oct. 29, 2013

Related U.S. Application Data

(60) Provisional application No. 61/853,711, filed on Apr. 10, 2013, provisional application No. 61/854,397, filed on Apr. 23, 2013.

(51) Int. Cl.
*H01R 27/00* (2006.01)
*H05K 5/02* (2006.01)
*H01R 13/52* (2006.01)

(52) U.S. Cl.
CPC .......... *H05K 5/0247* (2013.01); *H01R 13/5219* (2013.01)

(58) Field of Classification Search
CPC .. H01R 12/724; H01R 13/6594; H01R 24/62; H01R 27/00; H01R 13/6315; H01R 12/721; H01R 24/60; H01R 29/00
USPC ......................................................... 439/218
See application file for complete search history.

(56) References Cited

U.S. PATENT DOCUMENTS

| | | | | |
|---|---|---|---|---|
| 4,637,704 A * | 1/1987 | Ishimura et al. | ............... | 396/301 |
| 4,639,112 A * | 1/1987 | Nakai et al. | ................... | 396/227 |
| 4,846,697 A * | 7/1989 | Rodgers | ................... | B60D 1/62 439/35 |
| 4,912,498 A * | 3/1990 | Nakai et al. | ..................... | 396/227 |
| 7,736,193 B2 * | 6/2010 | Edeler et al. | ................... | 439/675 |
| 2008/0167578 A1 * | 7/2008 | Bryer | ................... | A61B 5/1411 600/583 |
| 2009/0091477 A1 * | 4/2009 | Mc Call | ................... | G01S 19/42 340/990 |
| 2010/0120534 A1 * | 5/2010 | Borissov et al. | ................. | 463/37 |
| 2010/0194423 A1 * | 8/2010 | Tago et al. | ..................... | 324/765 |
| 2012/0019391 A1 * | 1/2012 | Goings | ................ | G01R 19/145 340/657 |
| 2013/0163768 A1 * | 6/2013 | Salter | ..................... | H04R 29/00 381/56 |

\* cited by examiner

*Primary Examiner* — Jean F Duverne
(74) *Attorney, Agent, or Firm* — Patents on Demand P.A.; Brian K. Buchheit; Scott M. Garrett

(57) ABSTRACT

An electronic device connection can include the connection points upon an external surface of a connection system of a first electronic device and the connection points upon the external surface of a connection system of a second electronic device. The connection points of the second electronic device can correspond to the connection points on the first electronic device. Contact between the corresponding connection points can allow a transmission of a data signals and power signals between the first and second electronic devices.

76 Claims, 4 Drawing Sheets

CIRCULAR ARRANGEMENT OF REDUNDANT CONNECTION POINTS FOR ELECTRONIC DEVICE COUPLING

CROSS-REFERENCE TO RELATED APPLICATIONS

This application claims priority to provisional application No. 61/853,711, entitled "System and Method for Stitching Videos Received from Multiple Unsynchronized Cameras", filed Apr. 10, 2013, as well as provisional application No. 61/854,397, entitled "360 Degrees Cameras", filed Apr. 23, 2013. Both provisional applications are hereby included in their entirety.

BACKGROUND

The present invention relates to the field of electronic device coupling and, more particularly, to a circular arrangement of redundant connection points for electronic device coupling.

Electronic devices have become more and more sophisticated in time. Many electronic devices rely upon various types of physical connectors (e.g., universal serial bus (USB) cable, high-speed serial bus (FireWire), etc.) to interface with other electronic devices. While this convention is acceptable for most uses of electronic devices, it requires having the appropriate physical connector available as well as the appropriate data ports on the two devices.

Further, most connectors become useless when a single pinout, the electronic input/output channel or pathway of the connector, becomes inoperable, likely caused by a damaged or dirty contact. For example, if a pin of a typical male pin-based connector is bent, the connector will not seat properly in the female receptacle, and the damage will most likely be exacerbated.

With pin-based connectors, a user is generally able to determine which connector is causing the connectivity problem with a physical inspection. However, it is near impossible for a typical user to discern which side of the connection is being problematic with contact-based plug connectors, like USB connectors; the side of the connection that is misaligned or is unable to send/receive the signal is not indicated.

BRIEF SUMMARY

One aspect of the present invention can include an electronic device connection. This electronic device connection can include the connection points upon an external surface of a connection system of a first electronic device and the connection points upon the external surface of a connection system of a second electronic device. The connection points of the second electronic device can correspond to the connection points on the first electronic device. Contact between the corresponding connection points can allow a transmission of a data signals and power signals between the first and second electronic devices.

Another aspect of the present invention can include an electronic device. The electronic device can include internal components that enable an electronic device to perform at least one function, a durable housing for protecting the plurality of internal components from environmental conditions, and an intelligent connection system configured to connect multiple electronic devices. The intelligent connection system can include one or more connectors upon an external surface of the electronic device. The connector can include connection points that allows data signals and power signals to be propagated between the connected electronic devices.

Yet another aspect of the present invention can include a configuration for electronic contacts. The configuration can utilize thirteen connection points upon an external surface of an electronic device arranged in a circle. Each connection point can be equidistantly-spaced along the circle. Each connection point, when in contact with a corresponding connection point of another electronic device, can allows data signals and power signals to be propagated.

DETAILED DESCRIPTION

Figure 1:
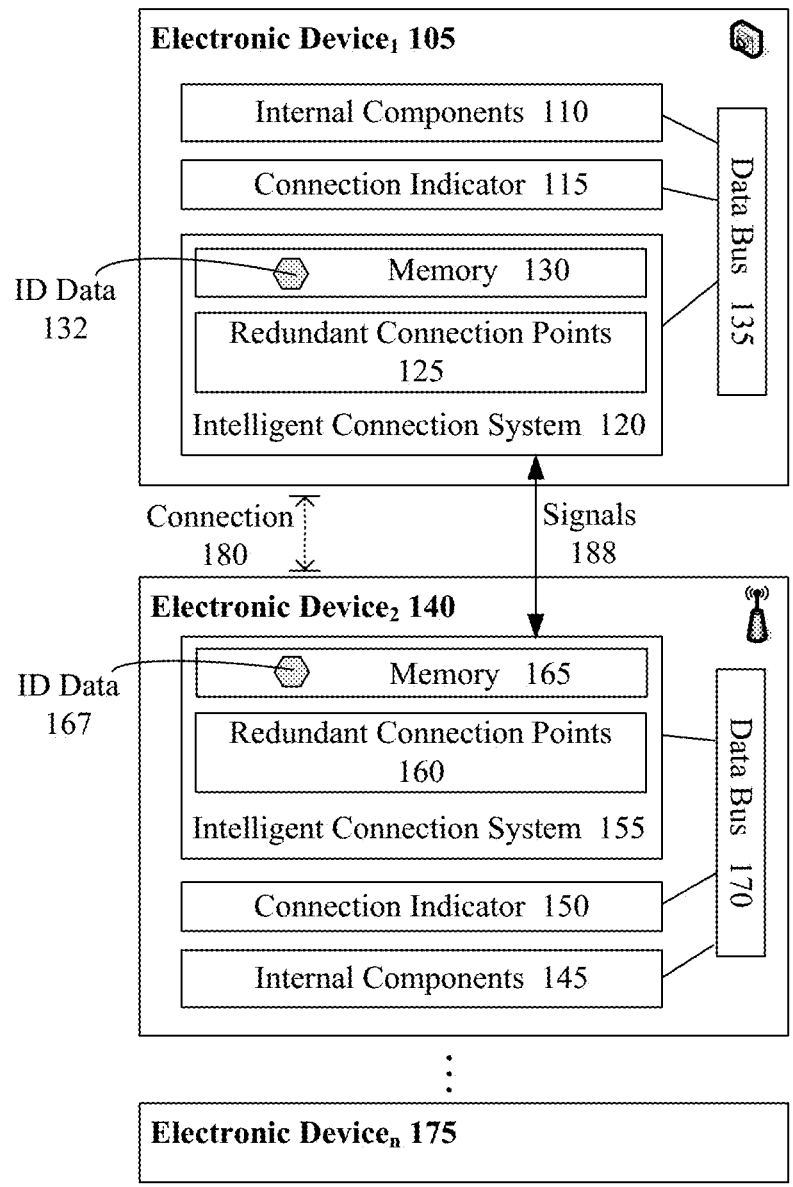
FIG. 1 is a block diagram illustrating a system for connecting electronic devices using redundant connection points in accordance with embodiments of the inventive arrangements disclosed herein.

The present invention discloses a solution for providing intelligent, redundant connection points between electronic devices. Such a solution can include a pair of mating connectors on two electronic devices; each connector having a matching set of connections points on an external surface. The connection points can be arranged in a circular pattern. When the connectors of the two electronic devices are mated, the corresponding sets of connections points can be aligned and in contact with each other. Power and/or data signals can then be transmitted over the connection points.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a block diagram illustrating a system 100 for connecting electronic devices 105, 140, and 170 using redundant connection points 125 and 160 in accordance with embodiments of the inventive arrangements disclosed herein. In system 100, a connection 180 can be made between a first electronic device 105 and a second electronic device 140 using an intelligent connection system 120 and 155 inherent to both devices 105 and 140.

The first and second electronic devices 105 and 140 can represent a variety of electronic and/or computing devices designed to interface with each other, to share data or function performance. For example, the first and second electronic devices 105 and 140 can be functional modules of a modular 360-degree video capture system or a portable music playing device and speaker set having a docking station.

The functionality of the electronic devices 105 and 140 can be defined by their respective internal components 110 and 145. The internal components 110 and 145 can represent the hardware and/or software components necessary to perform the functions of the electronic devices 105 and 140. For example, the internal components 110 of a digital camera 105 can include the camera hardware as well as the hardware (e.g., processor, memory, etc.) required to support an image capturing or processing software application.

The intelligent connection system 120 and 155 can be an element of each electronic device 105 and 140. The intelligent connection system 120 and 155 can represent a mechanism that creates a connection 180 between the first and second electronic devices 105 and 140 that allows the transmission of signals 185 between the electronic devices 105 and 140. The signals 185 can transmit data or power between the electronic devices 105 and 140.

The intelligent connection system 120 and 155 can utilize a variety of coupling mechanisms, dependent upon the requirements and/or capabilities of the electronic devices 105 and 140. For example, the intelligent connection system 120 and 155 can create the connection 180 using a plug and socket mechanism. Further, the plug and socket can utilize a screw-based coupling mechanism to ensure security, proper alignment, and mating. Locking and/or keying mechanisms can also be used by the intelligent connection system 120 and 155.

The intelligent connection system 120 and 155 can include redundant connection points 125 and 160 and a persistent memory storage medium, herein referred to as memory 130 and 165. The redundant connection points 125 and 160 can represent the means by which the connection 180 is made and the signals 185 are passed between the first and second electronic devices 105 and 140. Depending upon implementation, signal 185 transmission between redundant connection points 125 and 160 can be unidirectional and/or bi-directional. Signals 185 can include power and/or data signals.

Each set of redundant connection points 125 and 160, as the name implies, can include redundancies that can make a secondary connection 180 using a second connection point 125 and 160 should a connection 180 using primary connection point 125 and 160 fail. The handling of redundant signal 185 transmission can be handled by a control program of the intelligent connection system 120 and 155 or each electronic device 105 and 140.

Memory 130 and 165 can be used to store identification data 132 and 167 for the electronic devices 105 and 140, respectively. The identification data 132 and 167 can be sent over the connection 180 to inform the connected electronic devices 105 and 140 of device functions and/or capabilities. Memory 130 and 165 can be further used to contain additional data, such as the aforementioned control program for the intelligent connection system 120 and 155.

When the redundant connection points 125 and 160 of the first and second electronic devices 105 and 140 are properly aligned, making the connection 180, the connection indicator 115 and 150 of each electronic device 105 and 140 can be activated. The connection indicator 115 and 150 can represent the means by which a user coupling the electronic devices 105 and 140 can be notified of a good or bad connection 180 between the electronic devices 105 and 140. The connection indicator 115 and 150 can utilize audio and/or visual indicators.

The internal components 110 and 145, connection indicator 115 and 150, and intelligent connection system 120 and 155 of each electronic device 105 and 140 can be connected to a data bus 135 and 170. The data bus 135 and 170 can represent the hardware and/or software for handling communications between the first and second electronic devices 105 and 140 using the intelligent connection system 120 and 155 as well as communications between the internal components 110 and 145, connection indicator 115 and 150, and the intelligent connection system 120 and 155.

The connection 180 approach can be extend beyond the first and second electronic devices 105 and 140 to additional electronic devices 175. These additional electronic devices 175 can also include the intelligent connection system having redundant connection points (not shown) that correspond to those used by the first and second electronic devices 105 and 140. That is, an additional electronic device 175 having six redundant connection points cannot be connected to a second electronic device 140 that has ten redundant connection points 160.

The first electronic device 105 can then communicate with the additional electronic device 175 through the second electronic device 140. Thus, each connection 180 made with an additional electronic device 175 can expand the overall data bus of the end device.

Figure 2:
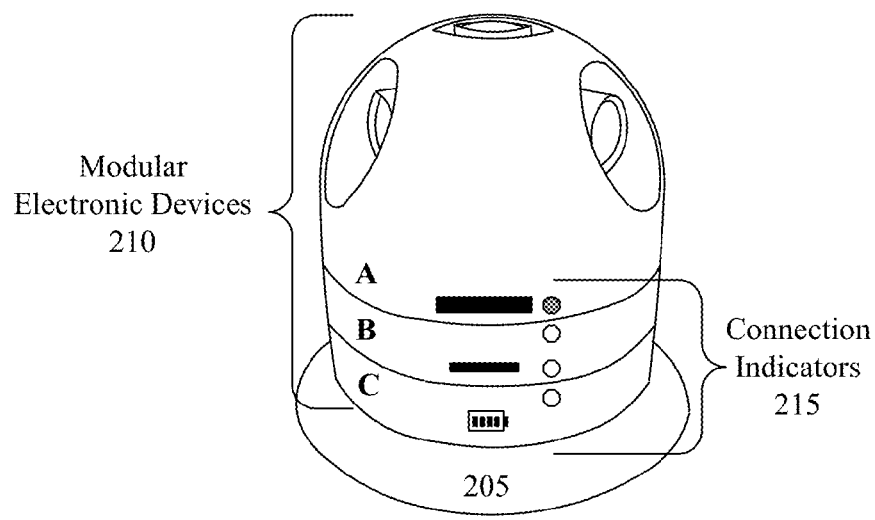
FIG. 2 depicts isometric views of example electronic devices that emphasize use of the connection indicator and redundant connection points in accordance with embodiments of the inventive arrangements disclosed herein.
Figure 2:
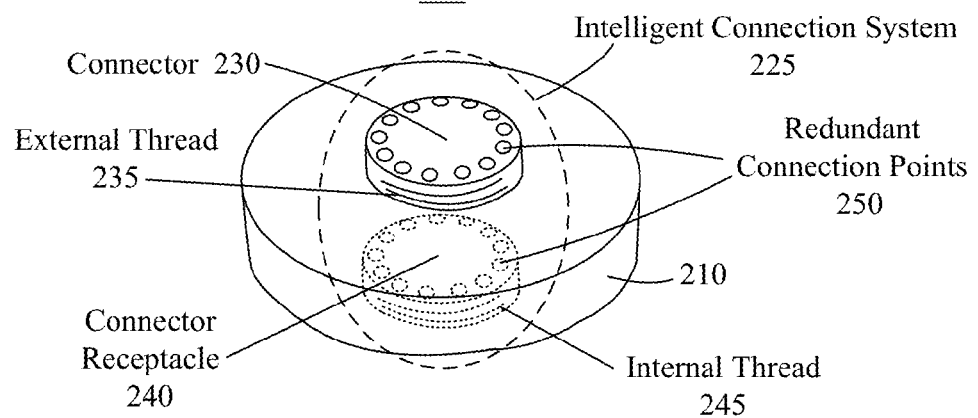

FIG. 2 depicts isometric views 200 and 220 of example electronic devices 205 and 210 that emphasize use of the connection indicator 215 and redundant connection points 250 in accordance with embodiments of the inventive arrangements disclosed herein. The example embodiment 200 can utilize the points taught in system 100.

The first isometric view 200 can be an example of a 360-degree video capture device 205 that is comprised of multiple, independent modular electronic devices 210. Each modular electronic device 210 can have a specific function. As shown in this example, the modular electronic devices 210 can provide a 360-degree video capture function (A), a data storage function (B), and a power supply function (C).

The modular electronic device 210 of the 360-degree video capture device 205 can be connected using the intelligent connection system 120 and 155 taught in system 100, and, as such each modular electronic device 210 can include one or more connection indicators 215. In this example, devices 210 A and B can each make only one connection to device 210 B, and, therefore, only have one connection indicator 215. Since device 210 B can make two connections (to device 210 A and to device 210 B), it can have two connection indicators 215, one for each connection.

In another contemplated embodiment, each modular electronic device 210 can utilize a single connection indicator 215 regardless of the number of connections it makes.

In this example, the connection indicators 215 can be represented by a light or LED that is turned ON (the white circle) when the connection between modular electronic devices 210 is "good" or operational, and turned OFF (the dark circle) when the connection is "bad" or signals are not being transmitted properly between the devices 210. This example can show that device 210 C has a "good" connection to device 210 B, device 210 B is transmitting properly to device 210 A, but device 210 A is not properly connected to or receiving signals from device 210 B.

Thus, the transmission problem can be narrowed down to device 210 A, and the user can then troubleshoot the connection of that device 210. For example, the user would most likely attempt to reseat device 210 A upon device 210 B to address a possible misalignment. The user could also check and/or clean the redundant connection points 250 of device 210 A before reseating.

Isometric view 220 can illustrate the intelligent connection system 225 and redundant connection points 250 of a modular electronic device 210, specifically device B. As shown in this view 220, the intelligent connection system 225 can be comprised of a connector 230 and a connector receptacle 240.

The connector 230 can be a circular element rising from the center of the top surface of the modular electronic device 210. Other shapes of the connector 230 can be contemplated and used without departing from the spirit of the present invention. The connector receptacle 240 can be a concave space extending inwards from the bottom surface of the modular electronic device 210, and can be of the proper size and shape to accommodate the connector 230 of another modular electronic device 210. Thus, the connector 230 of device 210 B can be coupled to the connector receptacle 240 of device 210 A, and the connector receptacle 240 of device 210 B to the connector 230 of device 210 C.

The surface of both the connector 230 and the connector receptacle 240 can have redundant connection points 250. Coupling of a connector 230 within a connector receptacle 240 can put the corresponding redundant connection points 250 of each modular electronic device 210 in contact with each other, allowing signal transmission.

As shown in this example, the redundant connection points 250 can be arranged on the surfaces in a circular pattern. Other arrangements (i.e., patterns and/or quantities) of the redundant connection points 250 can be contemplated and used based upon design considerations of the electronic devices 210.

In this example, the intelligent connection system 225 can utilize a screw-based coupling mechanism. As such, the connector 230 can include external threads 230 that are able to many with the internal threads 245 of a connector receptacle 240.

Figure 3:
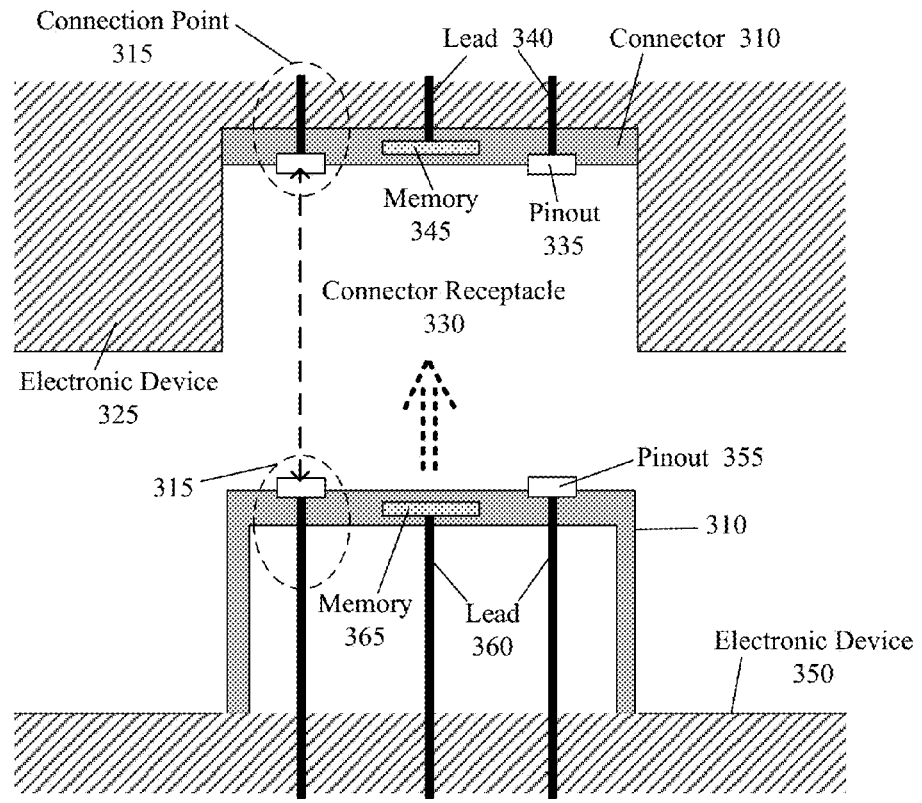
FIG. 3 is a collection of views depicting the connection points in accordance with embodiments of the inventive arrangements disclosed herein.

FIG. 3 is a collection 300 of views 305 and 320 depicting the connection points 315 in accordance with embodiments of the inventive arrangements disclosed herein. The connection points 315 highlighted in collection 300 can be utilized within the context of system 100 and/or modular electronic devices 210 of FIG. 2.

The top view 305 can be of a circular connector 310 like the connector 230 shown in view 220 of FIG. 2. The connector 310 can have thirteen connection points 315 on its external (top) surface. The connection points 315 can be arranged in a circular pattern. The circular pattern of the connection points 315 can be concentric with the connector 310 and the connection points 315 can be equidistantly-spaced along the circle.

The connector 310 can be made of a durable material that is suitable material for having the connection points 315 affixed upon or embed within. That is, the connector 310 material should be such as to not interfere with signal transmissions between the connection points 315.

Cross-sectional view 320 can illustrate the coupling between the connectors 310 and the connection points 315 of two electronic devices 325 and 350. The connector 310 element of each electronic device 325 and 350 can be represented by the gray-colored area.

The top electronic device 325 can have the connector receptacle 330 that is receiving the connector 310 of the bottom electronic device 350. In this example, the connector receptacle 330 can be shown as having a connector 310. This was done for the sake of terminology, since it is the connector 310 that includes the surface having the connection points 315, regardless of whether the connector 310 is male (a protrusion) or female (a receptacle).

A connection point 315 can be comprised of a pinout 335 and 355 and a lead 340 and 360. Since pinouts 335 and 355 and leads 340 and 360 are well known in the art, specific details of these elements 335, 355, 340, and 360 need not be detailed herein. The pinouts 335 and 355 can represent the contact point where signal transmission can occur between the electronic devices 325 and 350 and should be made from a material suitable for signal transmission. The pinouts 335 and 355 can be affixed to or embedded within the connector 310, as appropriate.

When the connector 310 of the bottom device 350 is inserted into the connector receptacle 330 of the top device 325, in the direction of the dashed arrow, the connection points 315 of the two electronic devices 325 and 350 should be aligned and in contact with each other, as indicated by the dashed line.

The connector 310 of each electronic device 325 and 350 can also include memory 345 and 365. Memory 345 and 365 can store information, such as identification data or executable instructions, for each electronic device 325 and 350. In another contemplated embodiment, memory 345 and 365 can be excluded from the connectors 310.

Figure 4:
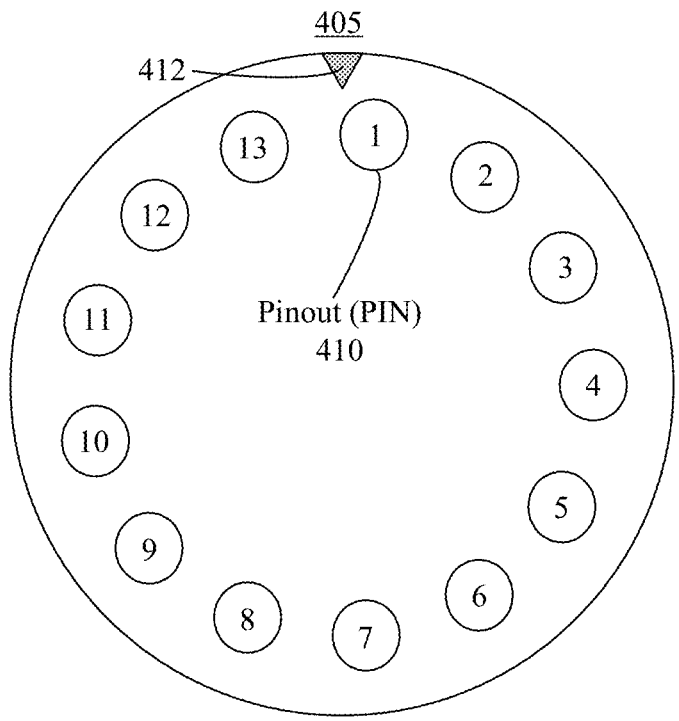
FIG. 4 is a pin diagram describing an example configuration and usage of the pinouts in accordance with an embodiment of the inventive arrangements disclosed herein.

FIG. 4 is a pin diagram 400 describing an example configuration 405 and usage 415 of the pinouts 410 in accordance with embodiments of the inventive arrangements disclosed herein. Pin diagram 400 can be utilized within the context of system 100, the diagrams 200 and 220 of FIG. 2, and/or the diagrams 305 and 320 of FIG. 3. It should be noted that the configuration 405 and pinout 410 usage 415 table are for illustrative purposes only, and are not meant to imply any limitation to the embodiments of the present invention.

The configuration 405 diagram can illustrate each pinout 410, referred to as a pin, in a numbered orientation with respect to a marking or other identifiable indicator, such as notch 412. By orienting the face of a connector with notch 412 in the position shown in the configuration 405 diagram, each pinout 410 of the connector can then match the indicated number.

In this example configuration 405, the connector can have thirteen pinouts 410. The purpose 425 of each numbered pin 420 can then be defined in the usage table 415. According to the usage 415 table, the pinout 410 identified as number 1 (to the immediate tight of notch 412) can be used for providing power.

Pinouts 410 numbered 2 and 8 can be used to transmit a first video signal; a second video signal can be transmitted by the pinouts 410 numbered 3 and 9; pinouts 410 numbered 4 and 10 can be used for a third video signal; and, the fourth video signal can be handled by the pinouts 410 numbered 5 and 11. These four separate video signals can correspond to the four video cameras used in a typical 360-degree video capture device like the modular electronic device A 210 of FIG. 2.

Two pinouts 410 can be listed for each video signal to indicate the redundancy built into the connection between the two electronic devices. One of the two pinouts 410 can be internally designated as the primary pinout 410, while the other pinout 410 can be activated if the transmission over the primary pinout 410 fails. For example, PIN 2 410 can be the primary pinout 410 for the first video signal. Should PIN 2 410 become inoperable, PIN 8 410 can be activated to transmit the first video signal. In essence, if the transmission of the first video signal cannot complete transmission using PIN 2 410, then the signal can be retransmitted on or the transmission rerouted to PIN 8 410.

The pinout 410 numbered 6 can be used to transmit device data like the identification data stored in the memory 345 or 365 of the connector 310. Additionally, the number 6 pinout 410 can be used to convey other types of communication messages and/or commands between the connected electronic devices. For example, a storage device can reach its storage limit and signal a connected camera to terminate video capture. Alternately, the storage device can notify a control program that it is approaching its storage limit via a message sent using the number 6 pinout 410. The control program can then compose a text message and convey the message using the number 6 pinout 410 to another connected device that is capable of sending the message to a designated recipient over an external communications network.

Pinouts 410 numbered 7 and 13 can be used for grounding electronic components. Finally, the pinout 410 numbered 12 can be used to activate the connection indicator. Additional circuitry can be required within the connector for triggering the signal of PIN 12 410.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. An electronic device connection comprising:
    a plurality of connection points upon an external surface of a connection system of a first electronic device; and
    a plurality of connection points upon the external surface of a connection system of a second electronic device that correspond to the plurality of connection points on the first electronic device, wherein contact between corresponding connection points allows a transmission of at least one of a data signal and a power signal between the first and second electronic devices, wherein each connection point further comprises:
        a pinout affixed on or in the external surface that provides surface contact for signal transmission; and
        a lead connecting the pinout to a corresponding set of electronic components for handling the at least one of the data signal and the power signal; wherein, when the connection system is an intelligent connection system, said connection further comprises: a persistent memory storage medium having identification data for the first electronic device encoded therein, wherein said persistent memory storage medium is located within a connector of the intelligent connection system and connected to at least one connection point of the plurality of connection points; and a persistent memory storage medium having identification data for the second electronic device encoded therein, wherein said persistent memory storage medium is located within a connector of the intelligent connection system and connected to at least one connection point of the plurality of connection points, and, wherein identification data for the second electronic device is able to be transmitted to the first electronic device, and vice versa.

2. The connection of claim 1, further comprising:
a data bus that connects the lead to the corresponding set of electronic components, wherein the data bus is configured to direct signal traffic between pinouts and sets of electronic components.

3. The connection of claim 1, wherein the plurality of connection points are arranged in a circular configuration upon the external surfaces.

4. The connection of claim 1, wherein the plurality of connection points includes redundant connection points, wherein an inability to transmit the at least one of the data signal and the power signal via a first connection point is compensated for using a corresponding redundant connection point.

5. The connection of claim 4, wherein the corresponding redundant connection point is used when transmission via the first connection point is determined to have failed.

6. The connection of claim 1, wherein the connection system includes a mechanism for mating corresponding connection points.

7. The connection of claim 1, further comprising:
a connection indicator that is activated when the plurality of connection points of the first electronic device are properly mated to the plurality of connection points of the second electronic device, wherein said activation comprises at least one of an audible indicator and a visual indicator.

8. The connection of claim 1, wherein the at least one of the data signal and the power signal is able to be propagated from the first electronic device to a third electronic device via the second electronic device, wherein the third electronic device includes a plurality of connection points coupled to the plurality of connection points of the second electronic device.

9. An electronic device comprising:
a plurality of internal components that enable an electronic device to perform at least one function;
a durable housing for protecting the plurality of internal components from environmental conditions;
an intelligent connection system configured to connect multiple electronic devices, wherein said intelligent connection system further comprises:
at least one connector upon an external surface of the electronic device, said connector further comprises:
a plurality of connection points, wherein contact between the plurality of connection points of the electronic device and the plurality of connection points of another connected electronic device allows at least one of a data signal and a power signal to be propagated between the connected electronic devices; and
a connection indicator that is activated when the plurality of connection points are properly mated to the plurality of connection points of the connected electronic device, wherein said activation comprises at least one of an audible indicator and a visual indicator; wherein the plurality of connection points comprises at least five connection points that are positioned equidistantly in a circular pattern, wherein a mating of the at least five connection points of the other device utilizes a screw-based coupling mechanism.

10. The device of claim 9, wherein a connection point further comprises:
a pinout affixed on or in the external surface that provides surface contact for signal transmission; and
a lead connecting the pinout to the plurality of internal components appropriate for handling the at least one of the data signal and the power signal.

11. The device of claim 10, further comprising:
a data bus that connects the lead to the plurality of internal components, wherein the data bus is configured to direct signal traffic between pinouts and the plurality of internal components.

12. The device of claim 9, wherein the at least one connector further comprises:
a persistent memory storage medium having identification data for the electronic device encoded therein, wherein the persistent memory storage is connected to at least one connection point, wherein the identification data is able to be broadcast to the connected electronic devices.

13. The device of claim 9, wherein the at least one connector comprises at least one of a protruding element that extends from a top surface of the electronic device and a concave receptacle on a bottom surface of the electronic device, wherein protruding elements are coupled to receptacles, wherein, through said coupling, corresponding connection points are aligned and are placed in contact with each other.

14. The device of claim 9, wherein the plurality of connection points includes redundant connection points, wherein an inability to transmit the at least one of the data signal and the power signal via a first connection point is compensated for using a corresponding redundant connection point.

15. The device of claim 14, wherein the corresponding redundant connection point is used when transmission via the first connection point is determined to have failed.

16. The device of claim 9, wherein the plurality of connection points comprises exactly thirteen connection points, wherein the thirteen connection points are positioned equidistantly in a circular pattern.

17. An electronic device connection comprising:
a plurality of connection points upon an external surface of a connection system of a first electronic device; and
a plurality of connection points upon the external surface of a connection system of a second electronic device that correspond to the plurality of connection points on the first electronic device, wherein contact between corresponding connection points allows a transmission of at least one of a data signal and a power signal between the first and second electronic devices, wherein the plurality of connection points includes redundant connection points, wherein an inability to transmit the at least one of the data signal and the power signal via a first connection point is compensated for using a corresponding redundant connection point; wherein, when the connection system is an intelligent connection system, said connection further comprises: a persistent memory storage medium having identification data for the first electronic device encoded therein, wherein said persistent memory storage medium is located within a connector of the intelligent connection system and connected to at least one connection point of the plurality of connection points; and a persistent memory storage medium having identification data for the second electronic device encoded therein, wherein said persistent memory storage medium is located within a connector of the intelligent connection system and connected to at least one connection point of the plurality of connection points, and, wherein identification data for the second electronic device is able to be transmitted to the first electronic device, and vice versa.

18. The connection of claim 17, wherein each connection point further comprises:
a pinout affixed on or in the external surface that provides surface contact for signal transmission; and
a lead connecting the pinout to a corresponding set of electronic components for handling the at least one of the data signal and the power signal.

19. The connection of claim 18, further comprising:
a data bus that connects the lead to the corresponding set of electronic components, wherein the data bus is configured to direct signal traffic between pinouts and sets of electronic components.

20. The connection of claim 17, wherein the plurality of connection points are arranged in a circular configuration upon the external surfaces.

21. The connection of claim 17, wherein the corresponding redundant connection point is used when transmission via the first connection point is determined to have failed.

22. The connection of claim 17, wherein the connection system includes a mechanism for mating corresponding connection points.

23. The connection of claim 17, further comprising:
a connection indicator that is activated when the plurality of connection points of the first electronic device are properly mated to the plurality of connection points of the second electronic device, wherein said activation comprises at least one of an audible indicator and a visual indicator.

24. The connection of claim 17, wherein the at least one of the data signal and the power signal is able to be propagated from the first electronic device to a third electronic device via the second electronic device, wherein the third electronic device includes a plurality of connection points coupled to the plurality of connection points of the second electronic device.

25. An electronic device connection comprising:
a plurality of connection points upon an external surface of a connection system of a first electronic device; and
a plurality of connection points upon the external surface of a connection system of a second electronic device that correspond to the plurality of connection points on the first electronic device, wherein contact between corresponding connection points allows a transmission of at least one of a data signal and a power signal between the first and second electronic devices, wherein the connection system is an intelligent connection system, said connection further comprises:
a persistent memory storage medium having identification data for the first electronic device encoded therein, wherein said persistent memory storage medium is located within a connector of the intelligent connection system and connected to at least one connection point of the plurality of connection points; and
a persistent memory storage medium having identification data for the second electronic device encoded therein, wherein said persistent memory storage medium is located within a connector of the intelligent connection system and connected to at least one connection point of the plurality of connection points, and, wherein identification data for the second electronic device is able to be transmitted to the first electronic device, and vice versa; wherein the plurality of connection points comprises at least five connection points that are positioned equidistantly in a circular pattern, wherein a mating of the at least five connection points of the other device utilizes a screw-based coupling mechanism.

26. The connection of claim 25, wherein each connection point further comprises:
a pinout affixed on or in the external surface that provides surface contact for signal transmission; and
a lead connecting the pinout to a corresponding set of electronic components for handling the at least one of the data signal and the power signal.

27. The connection of claim 26, further comprising:
a data bus that connects the lead to the corresponding set of electronic components, wherein the data bus is configured to direct signal traffic between pinouts and sets of electronic components.

28. The connection of claim 25, wherein the plurality of connection points are arranged in a circular configuration upon the external surfaces.

29. The connection of claim 25, wherein the plurality of connection points includes redundant connection points, wherein an inability to transmit the at least one of the data signal and the power signal via a first connection point is compensated for using a corresponding redundant connection point.

30. The connection of claim 29, wherein the corresponding redundant connection point is used when transmission via the first connection point is determined to have failed.

31. The connection of claim 25, wherein the connection system includes a mechanism for mating corresponding connection points.

32. The connection of claim 25, further comprising:
a connection indicator that is activated when the plurality of connection points of the first electronic device are properly mated to the plurality of connection points of the second electronic device, wherein said activation comprises at least one of an audible indicator and a visual indicator.

33. The connection of claim 25, wherein the at least one of the data signal and the power signal is able to be propagated from the first electronic device to a third electronic device via the second electronic device, wherein the third electronic device includes a plurality of connection points coupled to the plurality of connection points of the second electronic device.

34. An electronic device connection comprising:
a plurality of connection points upon an external surface of a connection system of a first electronic device; and
a plurality of connection points upon the external surface of a connection system of a second electronic device that correspond to the plurality of connection points on the first electronic device, wherein contact between corresponding connection points allows a transmission of at least one of a data signal and a power signal between the first and second electronic devices; and
a connection indicator that is activated when the plurality of connection points of the first electronic device are properly mated to the plurality of connection points of the second electronic device, wherein said activation comprises at least one of an audible indicator and a visual indicator; wherein, when the connection system is an intelligent connection system, said connection further comprises: a persistent memory storage medium having identification data for the first electronic device encoded therein, wherein said persistent memory storage medium is located within a connector of the intelligent connection system and connected to at least one connection point of the plurality of connection points; and a persistent memory storage medium having identification data for the second electronic device encoded therein, wherein said persistent memory storage medium is located within a connector of the intelligent connection system and connected to at least one connection point of the plurality of connection points, and, wherein identification data for the second electronic device is able to be transmitted to the first electronic device, and vice versa.

35. The connection of claim 34, wherein each connection point further comprises:
a pinout affixed on or in the external surface that provides surface contact for signal transmission; and
a lead connecting the pinout to a corresponding set of electronic components for handling the at least one of the data signal and the power signal.

36. The connection of claim 35, further comprising:
a data bus that connects the lead to the corresponding set of electronic components, wherein the data bus is configured to direct signal traffic between pinouts and sets of electronic components.

37. The connection of claim 34, wherein the plurality of connection points are arranged in a circular configuration upon the external surfaces.

38. The connection of claim 34, wherein the plurality of connection points includes redundant connection points, wherein an inability to transmit the at least one of the data signal and the power signal via a first connection point is compensated for using a corresponding redundant connection point.

39. The connection of claim 38, wherein the corresponding redundant connection point is used when transmission via the first connection point is determined to have failed.

40. The connection of claim 34, wherein the connection system includes a mechanism for mating corresponding connection points.

41. The connection of claim 34, wherein the at least one of the data signal and the power signal is able to be propagated from the first electronic device to a third electronic device via the second electronic device, wherein the third electronic device includes a plurality of connection points coupled to the plurality of connection points of the second electronic device.

42. The electronic device connection comprising:
a plurality of connection points upon an external surface of a connection system of a first electronic device; and
a plurality of connection points upon the external surface of a connection system of a second electronic device that correspond to the plurality of connection points on the first electronic device, wherein contact between corresponding connection points allows a transmission of at least one of a data signal and a power signal between the first and second electronic devices, wherein the at least one of the data signal and the power signal is able to be propagated from the first electronic device to a third electronic device via the second electronic device, wherein the third electronic device includes a plurality of connection points coupled to the plurality of connection points of the second electronic device; wherein each connection point further comprises: a pinout affixed on or in the external surface that provides surface contact for signal transmission; and a lead connecting the pinout to a corresponding set of electronic components for handling the at least one of the data signal and the power signal; wherein, when the connection system is an intelligent connection system, said connection further comprises: a persistent memory storage medium having identification data for the first electronic device encoded therein, wherein said persistent memory storage medium is located within a connector of the intelligent connection system and connected to at least one connection point of the plurality of connection points; and a persistent memory storage medium having identification data for the second electronic device encoded therein, wherein said persistent memory storage medium is located within a connector of the intelligent connection system and connected to at least one connection point of the plurality of connection points, and, wherein identification data for the second electronic device is able to be transmitted to the first electronic device, and vice versa.

43. The connection of claim 42, further comprising:
a data bus that connects the lead to the corresponding set of electronic components, wherein the data bus is configured to direct signal traffic between pinouts and sets of electronic components.

44. The connection of claim 42, wherein the plurality of connection points are arranged in a circular configuration upon the external surfaces.

45. The connection of claim 42, wherein the plurality of connection points includes redundant connection points, wherein an inability to transmit the at least one of the data signal and the power signal via a first connection point is compensated for using a corresponding redundant connection point.

46. The connection of claim 45, wherein the corresponding redundant connection point is used when transmission via the first connection point is determined to have failed.

47. The connection of claim 42, wherein the connection system includes a mechanism for mating corresponding connection points.

48. The connection of claim 42, further comprising:
a connection indicator that is activated when the plurality of connection points of the first electronic device are properly mated to the plurality of connection points of the second electronic device, wherein said activation comprises at least one of an audible indicator and a visual indicator.

49. An electronic device comprising:
a plurality of internal components that enable an electronic device to perform at least one function;
a durable housing for protecting the plurality of internal components from environmental conditions; and
an intelligent connection system configured to connect multiple electronic devices, wherein said intelligent connection system further comprises:
at least one connector upon an external surface of the electronic device, said connector further comprises:
a plurality of connection points, wherein contact between the plurality of connection points of the electronic device and the plurality of connection points of another connected electronic device allows at least one of a data signal and a power signal to be propagated between the connected electronic devices, wherein a connection point further comprises:

a pinout affixed on or in the external surface that provides surface contact for signal transmission; and a lead connecting the pinout to the plurality of internal components appropriate for handling the at least one of the data signal and the power signal; wherein the plurality of connection points comprises at least five connection points that are positioned equidistantly in a circular pattern, wherein a mating of the at least five connection points of the other device utilizes a screw-based coupling mechanism.

50. The device of claim 49, further comprising:
a connection indicator that is activated when the plurality of connection points are properly mated to the plurality of connection points of the connected electronic device, wherein said activation comprises at least one of an audible indicator and a visual indicator.

51. The device of claim 49, further comprising:
a data bus that connects the lead to the plurality of internal components, wherein the data bus is configured to direct signal traffic between pinouts and the plurality of internal components.

52. The device of claim 49, wherein the at least one connector further comprises:
a persistent memory storage medium having identification data for the electronic device encoded therein, wherein the persistent memory storage is connected to at least one connection point, wherein the identification data is able to be broadcast to the connected electronic devices.

53. The device of claim 49, wherein the at least one connector comprises at least one of a protruding element that extends from a top surface of the electronic device and a concave receptacle on a bottom surface of the electronic device, wherein protruding elements are coupled to receptacles, wherein, through said coupling, corresponding connection points are aligned and are placed in contact with each other.

54. The device of claim 49, wherein the plurality of connection points includes redundant connection points, wherein an inability to transmit the at least one of the data signal and the power signal via a first connection point is compensated for using a corresponding redundant connection point.

55. The device of claim 54, wherein the corresponding redundant connection point is used when transmission via the first connection point is determined to have failed.

56. An electronic device comprising:
a plurality of internal components that enable an electronic device to perform at least one function;
a durable housing for protecting the plurality of internal components from environmental conditions; and
an intelligent connection system configured to connect multiple electronic devices, wherein said intelligent connection system further comprises:
at least one connector upon an external surface of the electronic device, said connector further comprises:
a plurality of connection points, wherein contact between the plurality of connection points of the electronic device and the plurality of connection points of another connected electronic device allows at least one of a data signal and a power signal to be propagated between the connected electronic devices; and
a persistent memory storage medium having identification data for the electronic device encoded therein, wherein the persistent memory storage is connected to at least one connection point, wherein the identification data is able to be broadcast to the connected electronic devices; wherein the plurality of connection points comprises at least five connection points that are positioned equidistantly in a circular pattern, wherein a mating of the at least five connection points of the other device utilizes a screw-based coupling mechanism.

57. The device of claim 56, further comprising:
a connection indicator that is activated when the plurality of connection points are properly mated to the plurality of connection points of the connected electronic device, wherein said activation comprises at least one of an audible indicator and a visual indicator.

58. The device of claim 56, wherein a connection point further comprises:
a pinout affixed on or in the external surface that provides surface contact for signal transmission; and
a lead connecting the pinout to the plurality of internal components appropriate for handling the at least one of the data signal and the power signal.

59. The device of claim 58, further comprising:
a data bus that connects the lead to the plurality of internal components, wherein the data bus is configured to direct signal traffic between pinouts and the plurality of internal components.

60. The device of claim 58, wherein the at least one connector comprises at least one of a protruding element that extends from a top surface of the electronic device and a concave receptacle on a bottom surface of the electronic device, wherein protruding elements are coupled to receptacles, wherein, through said coupling, corresponding connection points are aligned and are placed in contact with each other.

61. The device of claim 58, wherein the plurality of connection points includes redundant connection points, wherein an inability to transmit the at least one of the data signal and the power signal via a first connection point is compensated for using a corresponding redundant connection point.

62. The device of claim 61, wherein the corresponding redundant connection point is used when transmission via the first connection point is determined to have failed.

63. An electronic device comprising:
a plurality of internal components that enable an electronic device to perform at least one function;
a durable housing for protecting the plurality of internal components from environmental conditions; and
an intelligent connection system configured to connect multiple electronic devices, wherein said intelligent connection system further comprises:
at least one connector upon an external surface of the electronic device, said connector further comprises:
a plurality of connection points, wherein contact between the plurality of connection points of the electronic device and the plurality of connection points of another connected electronic device allows at least one of a data signal and a power signal to be propagated between the connected electronic devices, wherein the at least one connector comprises at least one of a protruding element that extends from a top surface of the electronic device and a concave receptacle on a bottom surface of the electronic device, wherein protruding elements are coupled to receptacles, wherein, through said coupling, corresponding connection points are aligned and are placed in contact with each other; wherein the plurality of connection points comprises at least five connection points that are positioned equidistantly in a circular pattern, wherein a mating of the at least five connection points of the other device utilizes a screw-based coupling mechanism.

64. The device of claim 63, further comprising:
a connection indicator that is activated when the plurality of connection points are properly mated to the plurality of connection points of the connected electronic device, wherein said activation comprises at least one of an audible indicator and a visual indicator.

65. The device of claim 63, wherein a connection point further comprises:
a pinout affixed on or in the external surface that provides surface contact for signal transmission; and
a lead connecting the pinout to the plurality of internal components appropriate for handling the at least one of the data signal and the power signal.

66. The device of claim 65, further comprising:
a data bus that connects the lead to the plurality of internal components, wherein the data bus is configured to direct signal traffic between pinouts and the plurality of internal components.

67. The device of claim 63, wherein the at least one connector further comprises:
a persistent memory storage medium having identification data for the electronic device encoded therein, wherein the persistent memory storage is connected to at least one connection point, wherein the identification data is able to be broadcast to the connected electronic devices.

68. The device of claim 63, wherein the plurality of connection points includes redundant connection points, wherein an inability to transmit the at least one of the data signal and the power signal via a first connection point is compensated for using a corresponding redundant connection point.

69. The device of claim 68, wherein the corresponding redundant connection point is used when transmission via the first connection point is determined to have failed.

70. An electronic device comprising:
a plurality of internal components that enable an electronic device to perform at least one function;
a durable housing for protecting the plurality of internal components from environmental conditions; and
an intelligent connection system configured to connect multiple electronic devices, wherein said intelligent connection system further comprises:
at least one connector upon an external surface of the electronic device, said connector further comprises:
a plurality of connection points, wherein contact between the plurality of connection points of the electronic device and the plurality of connection points of another connected electronic device allows at least one of a data signal and a power signal to be propagated between the connected electronic devices, wherein the plurality of connection points includes redundant connection points, wherein an inability to transmit the at least one of the data signal and the power signal via a first connection point is compensated for using a corresponding redundant connection point; wherein the plurality of connection points comprises at least five connection points that are positioned equidistantly in a circular pattern, wherein a mating of the at least five connection points of the other device utilizes a screw-based coupling mechanism.

71. The device of claim 70, further comprising:
a connection indicator that is activated when the plurality of connection points are properly mated to the plurality of connection points of the connected electronic device, wherein said activation comprises at least one of an audible indicator and a visual indicator.

72. The device of claim 70, wherein a connection point further comprises:
a pinout affixed on or in the external surface that provides surface contact for signal transmission; and
a lead connecting the pinout to the plurality of internal components appropriate for handling the at least one of the data signal and the power signal.

73. The device of claim 72, further comprising:
a data bus that connects the lead to the plurality of internal components, wherein the data bus is configured to direct signal traffic between pinouts and the plurality of internal components.

74. The device of claim 70, wherein the at least one connector further comprises:
a persistent memory storage medium having identification data for the electronic device encoded therein, wherein the persistent memory storage is connected to at least one connection point, wherein the identification data is able to be broadcast to the connected electronic devices.

75. The device of claim 70, wherein the at least one connector comprises at least one of a protruding element that extends from a top surface of the electronic device and a concave receptacle on a bottom surface of the electronic device, wherein protruding elements are coupled to receptacles, wherein, through said coupling, corresponding connection points are aligned and are placed in contact with each other.

76. The device of claim 70, wherein the corresponding redundant connection point is used when transmission via the first connection point is determined to have failed.

* * * * *